(12) United States Patent
Hsu et al.

(10) Patent No.: US 10,276,437 B2
(45) Date of Patent: Apr. 30, 2019

(54) CONTACT STRUCTURE OF GATE STRUCTURE

(71) Applicant: Taiwan Semiconductor Manufacturing Company Limited, Hsinchu (TW)

(72) Inventors: Audrey Hsiao-Chiu Hsu, Hsinchu (TW); Fu-Kai Yang, Hsinchu (TW); Mei-Yun Wang, Hsinchu (TW); Hsien-Cheng Wang, Hsinchu (TW); Shih-Wen Liu, Taoyuan County (TW); Hsin-Ying Lin, Tainan (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 15/384,446

(22) Filed: Dec. 20, 2016

(65) Prior Publication Data
US 2017/0103918 A1 Apr. 13, 2017

Related U.S. Application Data

(60) Division of application No. 14/840,099, filed on Aug. 31, 2015, now Pat. No. 9,536,754, which is a
(Continued)

(51) Int. Cl.
*H01L 29/49* (2006.01)
*H01L 29/66* (2006.01)
(Continued)

(52) U.S. Cl.
CPC .... *H01L 21/76897* (2013.01); *H01L 21/2633* (2013.01); *H01L 21/28518* (2013.01);
(Continued)

(58) Field of Classification Search
CPC ............... H01L 29/6656; H01L 29/665; H01L 29/66515; H01L 29/6653
See application file for complete search history.

(56) References Cited

U.S. PATENT DOCUMENTS 7,221,015 B2   5/2007   Ando et al.
9,123,563 B2   9/2015   Hsu et al.
(Continued)

FOREIGN PATENT DOCUMENTS

TW   200511399 A1   3/2005
TW   201023344 A1   6/2010

OTHER PUBLICATIONS

Taiwan Notice of Allowance; Application No. 103146196; dated Aug. 19, 2016.

*Primary Examiner* — Ngan V Ngo
(74) *Attorney, Agent, or Firm* — Jones Day (57) ABSTRACT

A method of forming a contact structure of a gate structure is provided. In the method, an oxidation layer and a first sidewall layer disposed between a first metal gate and a second metal gate are etched to expose an underlying silicon substrate. A silicide portion defined by a contact profile is deposited in the exposed portion of the silicon substrate. A second sidewall layer substantially covers the first sidewall layer and at least partially covering the silicide portion is formed after depositing the silicide portion. A metal glue layer is deposited around the first metal gate and the second metal gate defining a trench above the silicide portion. A metal plug is deposited within the trench.

20 Claims, 7 Drawing Sheets

Related U.S. Application Data continuation of application No. 14/157,576, filed on Jan. 17, 2014, now Pat. No. 9,123,563.

(51) Int. Cl.

| | | |
|---|---|---|
| *H01L 21/263* | (2006.01) | |
| *H01L 21/285* | (2006.01) | |
| *H01L 21/311* | (2006.01) | |
| *H01L 21/321* | (2006.01) | |
| *H01L 21/768* | (2006.01) | |
| *H01L 23/485* | (2006.01) | |
| *H01L 23/532* | (2006.01) | |
| *H01L 23/535* | (2006.01) | |
| *H01L 27/088* | (2006.01) | |
| *H01L 21/3205* | (2006.01) | |
| *H01L 21/8234* | (2006.01) | |

(52) U.S. Cl.
CPC .... *H01L 21/31116* (2013.01); *H01L 21/3212* (2013.01); *H01L 21/32051* (2013.01); *H01L 21/32053* (2013.01); *H01L 21/32105* (2013.01); *H01L 21/7684* (2013.01); *H01L 21/76805* (2013.01); *H01L 21/76831* (2013.01); *H01L 21/823425* (2013.01); *H01L 21/823475* (2013.01); *H01L 23/485* (2013.01); *H01L 23/535* (2013.01); *H01L 23/53261* (2013.01); *H01L 23/53266* (2013.01); *H01L 27/088* (2013.01); *H01L 29/4933* (2013.01); *H01L 29/665* (2013.01); *H01L 29/6653* (2013.01); *H01L 29/6656* (2013.01); *H01L 29/66515* (2013.01); *H01L 2924/0002* (2013.01)

(56) References Cited

U.S. PATENT DOCUMENTS

| | | |
|---|---|---|
| 2003/0227046 A1 | 12/2003 | Ando et al. |
| 2007/0040196 A1 | 2/2007 | Matsuura |
| 2008/0054328 A1* | 3/2008 | Wang ................ H01L 27/11502 257/306 |
| 2008/0061331 A1* | 3/2008 | Wang ................ H01L 27/11502 257/295 |
| 2008/0191253 A1* | 8/2008 | Kikuchi ............ H01L 21/76814 257/295 |
| 2009/0026514 A1* | 1/2009 | Wang ................ H01L 27/11507 257/295 |
| 2011/0272753 A1 | 11/2011 | Funayama et al. |
| 2012/0032299 A1* | 2/2012 | Wang ................ H01L 27/11507 257/532 |
| 2013/0277756 A1* | 10/2013 | Kawano ............. H01L 23/544 257/384 |
| 2014/0273386 A1* | 9/2014 | Tsao .................... H01L 29/665 438/301 |
| 2014/0327141 A1* | 11/2014 | Yu .................... H01L 23/53238 257/751 |

* cited by examiner

CONTACT STRUCTURE OF GATE STRUCTURE

CROSS-REFERENCE TO RELATED APPLICATIONS

This application is a divisional application of U.S. patent application Ser. No. 14/840,099, entitled "Method of Forming Contact Structure of Gate Structure," filed Aug. 31, 2015, which is a continuation of U.S. patent application Ser. No. 14/157,576, now U.S. Pat. No. 9,123,563, entitled "Method of Forming Contact Structure of Gate Structure," filed Jan. 17, 2014, both of which are incorporated herein by reference in their entireties.

FIELD

This disclosure relates to semiconductor technology, and more particularly, a method of forming a contact structure of a gate structure.

BACKGROUND

In a contact formation process of a gate structure of a MOSFET, a contact structure is patterned by lithography and etching, and a silicide portion is formed via a pattern of the contact structure. However, the small size of the silicide portion may decrease the stability and the capability of the contact structure after formation of the contact structure is complete.

DETAILED DESCRIPTION

Figure 1:
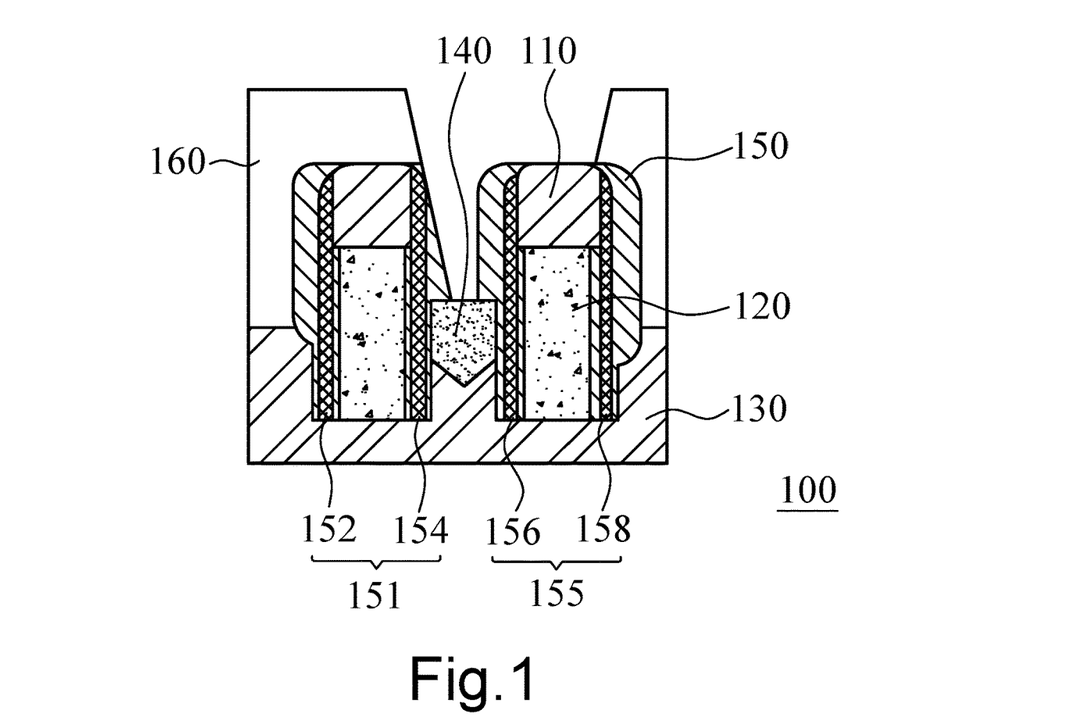
FIG. 1 illustrates a cross-sectional view of a contact structure of a gate structure.

FIG. 1 illustrates a cross-sectional view of a contact structure 100 of a gate structure. The contact structure 100 includes a hard mask layer 110, a metal gate layer 120, a substrate layer 130, an epitaxial layer 140, an insulator layer 150 for the hard mask layer 110, a gap-fill layer 160, a first gate 151, and a second gate 155.

The first gate 151 includes part of the hard mask layer 110, part of the metal gate layer 120, a first left-side spacer 152, and a first right-side spacer 154. The second gate 155 includes part of the hard mask layer 110, part of the metal gate layer 120, a second left-side spacer 156, and a second right-side spacer 158.

Under a self-align contact process, if the hard mask layer 110 is not thick enough, after a gap-filling process for depositing the gap-fill layer 160, heights of the first gate 151 and the second gate 155 may not be high enough; a process for pushing the metal gate layer 120 downwards may not succeed; and the gap-filling process may not succeed. Moreover, using the hard mask layer 110 may raise complexity of forming the contact structure 100, and difficulty of precisely aligning a contact structure for the epitaxial layer 140, which will be formed into a source or a drain.

Figure 2:
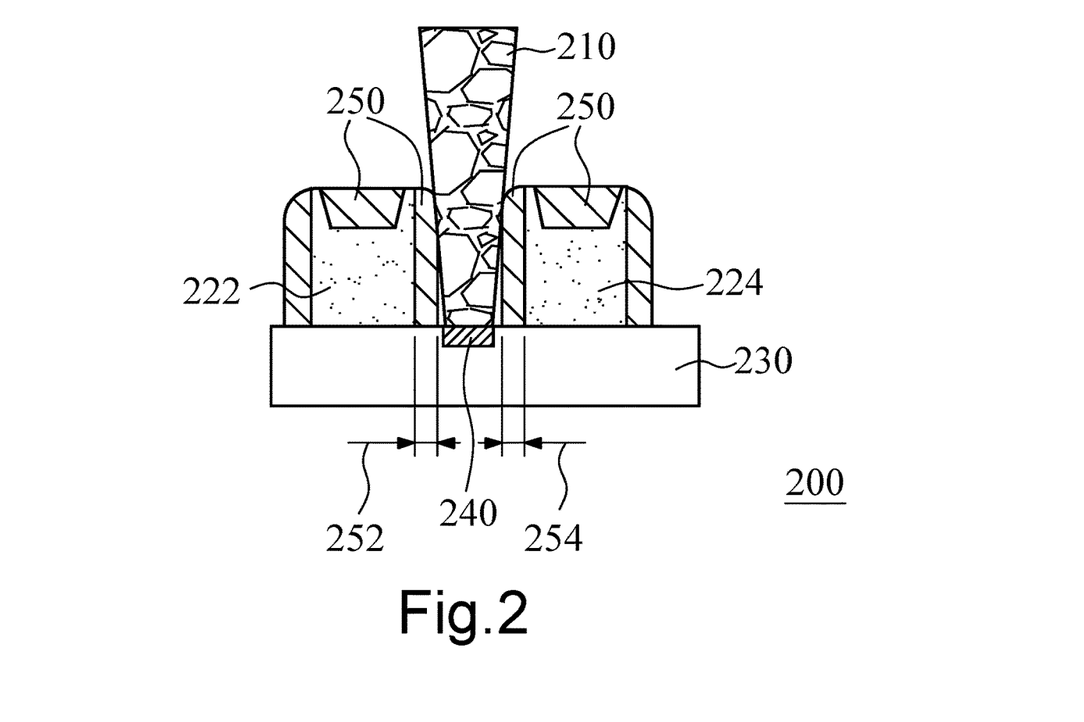
FIG. 2 illustrates a cross-sectional view of a contact structure of a gate structure after forming a silicide layer.

FIG. 2 illustrates a cross-sectional view of a contact structure 200 of a gate structure after forming a silicide layer. The contact structure 200 includes a contact layer 210, a first gate 222, a second gate 224, an oxidation layer 230, a silicide layer 240, and an insulator layer 250. The insulator layer 250 is utilized for coating most of the first gate 222 and the second gate 224. The insulator layer 250 is also utilized for isolating the first gate 222 and the second gate 224 from the contact layer 210 to reduce hole and electron scattering.

Before formation of the contact structure 200, a photolithography process and an etching process are performed. A trench holding the contact layer 210 is thus formed between the first gate 222 and the second gate 224. The trench may have a high aspect ratio. While depositing the contact layer 210 within the trench, the high aspect ratio of the trench limits a contact area of a bottom of the contact layer 210. The limited contact area of the bottom of the contact layer 210 also limits an area of the sicilide layer 240.

The small area of the silicide layer 240 also results in large resistance of the silicide layer 240, and operation of the contact structure 200 will be difficult to manipulate due to the large resistance of the silicide layer 240.

If a width of the insulator layer 250 (such as a width 252 or a width 254 shown in FIG. 2) is not large enough, the hole and electron scattering between the contact layer 210 and the first gate 222 or the second gate 224 may not be effectively alleviated. However, a large width of the insulator layer 250 also results in a high aspect ratio of the trench holding the contact layer 210 and a small area of the silicide layer 240, and results in an increased size the contact structure 200.

If the area of the silicide layer 240 is limited, i.e. a contact size of the contact structure 200, flexibility of critical dimension uniformity (CDU) of the contact structure 200 may also be restricted.

In one example, the silicide layer 240 may consist essentially of NiSi, and a temperature of forming the silicide layer 240 may be about 400-500 centigrade degrees. However, since formation of the contact structure 200 may experience a high-K metal gate last (HK-last) process, and since a temperature of using the high-K metal gate last process may be about 800-1000 centigrade degrees, the silicide layer 240 may be damaged by the high temperature of the high-K metal gate last process.

FIGS. 3-8 illustrate various cross-sectional views of a contact structure 300 of a gate structure during formation of the contact structure 300 according to a first embodiment.

Figure 3:
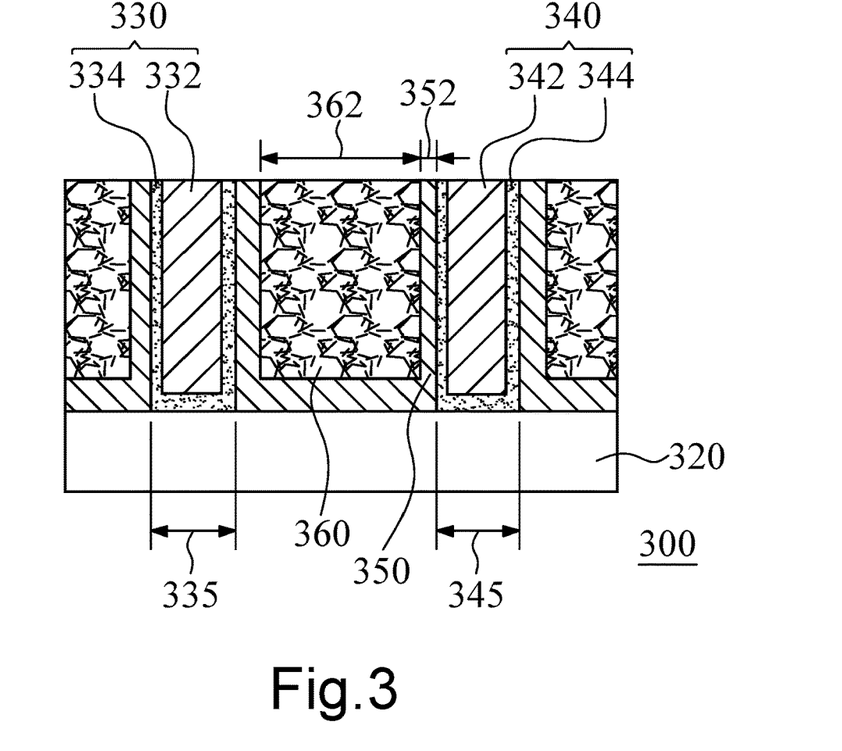
FIGS. 3-8 illustrate various cross-sectional views of a contact structure of a gate structure during formation of the contact structure according to a first embodiment.

In FIG. 3, the contact structure 300 includes a silicon substrate 320, a first metal gate 330, a second metal gate 340, a first sidewall layer 350, and an oxidation layer 360.

A high-K metal gate last process has been completed to form the first metal gate 330 and the second metal gate 340. The first metal gate 330 includes a first metal body 332 and a first spacer 334 for at least partially coating the first metal body 332. The second gate 340 includes a second metal body 342 and a second spacer 344 for at least partially coating the second metal body 342.

The first sidewall layer 350 is interposed between the first gate 330 and the second gate 340. A first lateral side (e.g. the right side) of the first metal gate 330 is oppose to a second lateral side (e.g. the left side) of the second metal gate 340.

In a first example, the first sidewall layer 350 is formed using a nitride-based film because of having high selectivity for withstanding etchants used in at least one following etching process.

In a second example, the first sidewall layer 350 is formed using a material selected from the group consisting of $SiN_x$, $SiO_{(1-x)}N_x$, $SiC_{(1-x)}N_x$, $SiO_{(1-x-y)}C_xN_y$, $Ti_{(1-x)}N_x$, and $Al_{(1-x)}N_x$. The material also has a high selectivity for withstanding etchants used in at least one following etching process.

In a third example, an average of a thickness 352 of the first sidewall layer 350 may be between about 1 nanometer (nm) and about 5 nm.

In a fourth example, a distance 362 between a first portion (a portion next to the spacer 334) of the first metal gate 330 and a second portion (a portion next to the spacer 344) of the first sidewall layer 350 may be between about 15 nm and 45 nm.

In a fifth example, a width 335 of the first metal gate 330 is between about 10 nm and about 30 nm, and a width 345 of the second metal gate 340 is between about 10 nm and about 30 nm.

In FIG. 3, a first chemical mechanical polishing (CMP) process may be optionally performed to planarize the first metal gate 330, the second metal gate 340, and the first sidewall layer 350.

Figure 4:
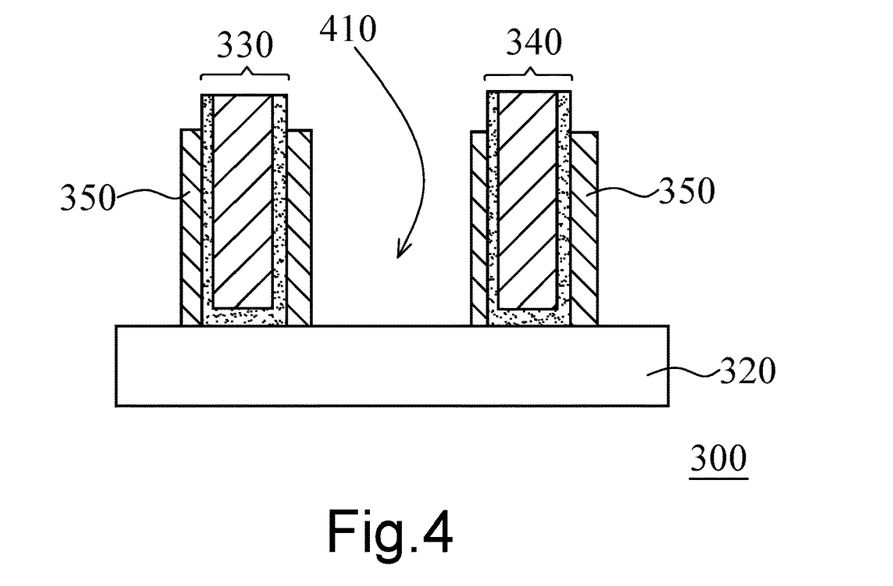

In FIG. 4, the oxidation layer 360 and part of the first sidewall layer 350 underlying the oxidation layer 360 are etched to expose the silicon substrate 320 underlying the oxidation layer 360. A contact profile 410 is thus defined between the first metal gate 330 and the second metal gate 340 in an interposed manner. Part of the first sidewall layer 350 that is in direct contact with the first metal gate 330 and the second metal gate 340 may also be slightly etched.

In one example, the oxidation layer 360 and part of the first sidewall layer 350 underlying the oxidation layer 360 may be etched using an isotropic etching process. In another example, the isotropic etching process is an ion bombardment process.

Figure 5:
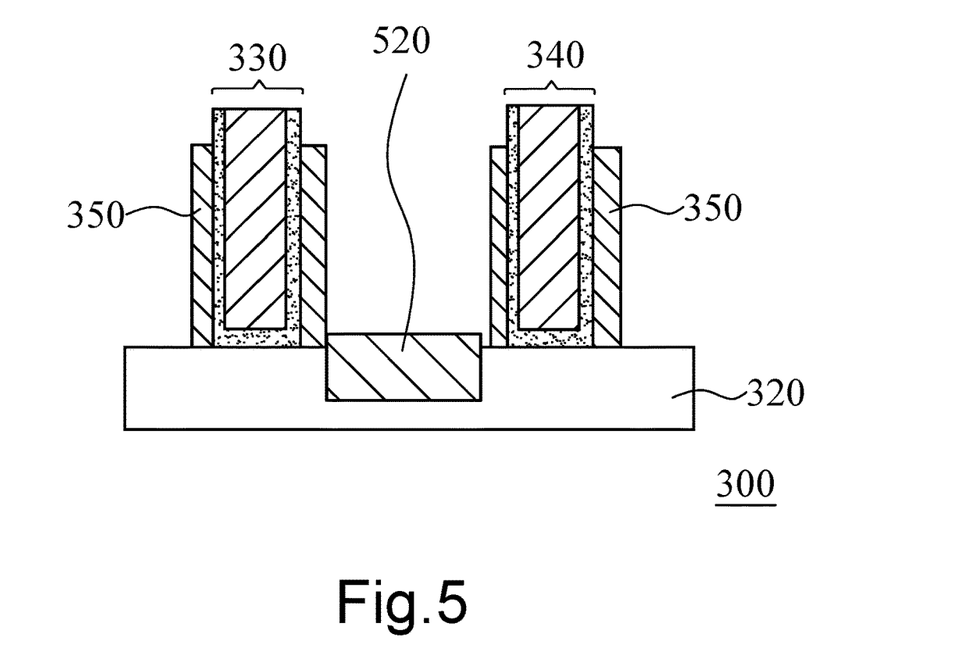

In FIG. 5, a silicide portion 520 is deposited following the contact profile 410 in an exposed portion of the silicon substrate 320.

In one example, the silicide portion 520 is deposited using a material selected from the group consisting of $Ti_{(1-x)}Si_x$, $Co_{(1-x)}Si_x$, $Ni_{(1-x)}Si_x$, $Ti_{(1-x)}Si_xGe$, $Co_{(1-x)}Si_xGe$, and $Ni_{(1-x)}Si_xGe$.

Figure 6:
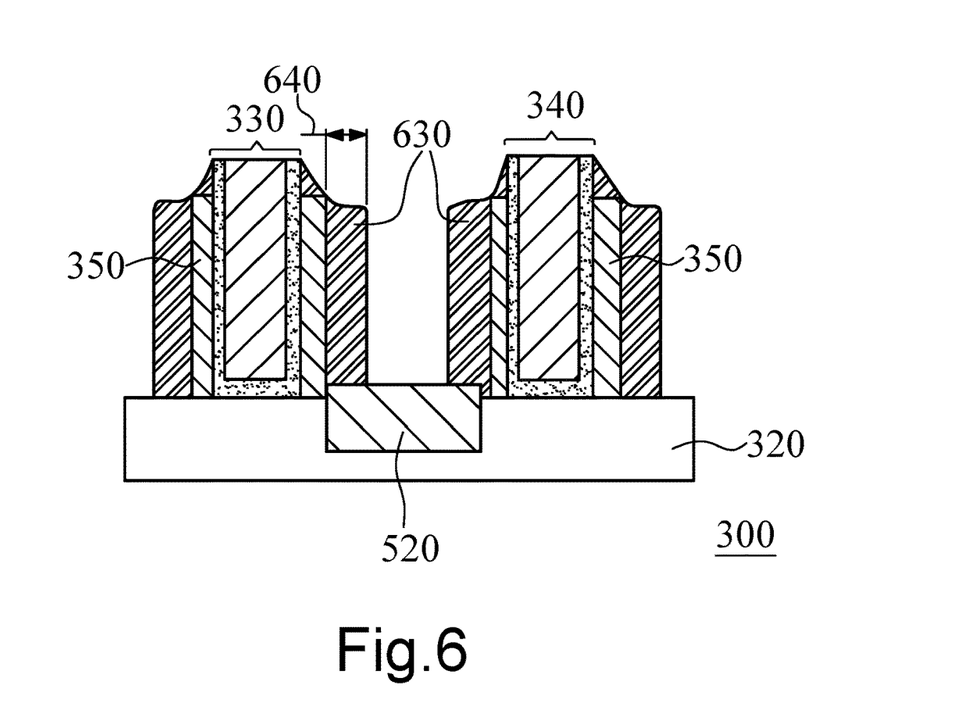

In FIG. 6, a second sidewall layer 630 is substantially formed to cover the first sidewall layer 350 and to at least partially cover the silicide portion 520.

In a first example, the second sidewall layer 630 is formed using a material selected from the group consisting of $SiO_x$, $SiO_xC_{(1-x)}$, $SiN_x$, $SiO_{(1-x)}N_x$, $SiC_{(1-x)}N_x$, $SiO_{(1-x-y)}C_xN_y$, $Ti_{(1-x)}N_x$, and $Al_{(1-x)}N_x$.

In a second example, an average of a thickness 640 of the second sidewall layer 630 is between about 10 angstrom (Å) and about 50 Å.

Figure 7:
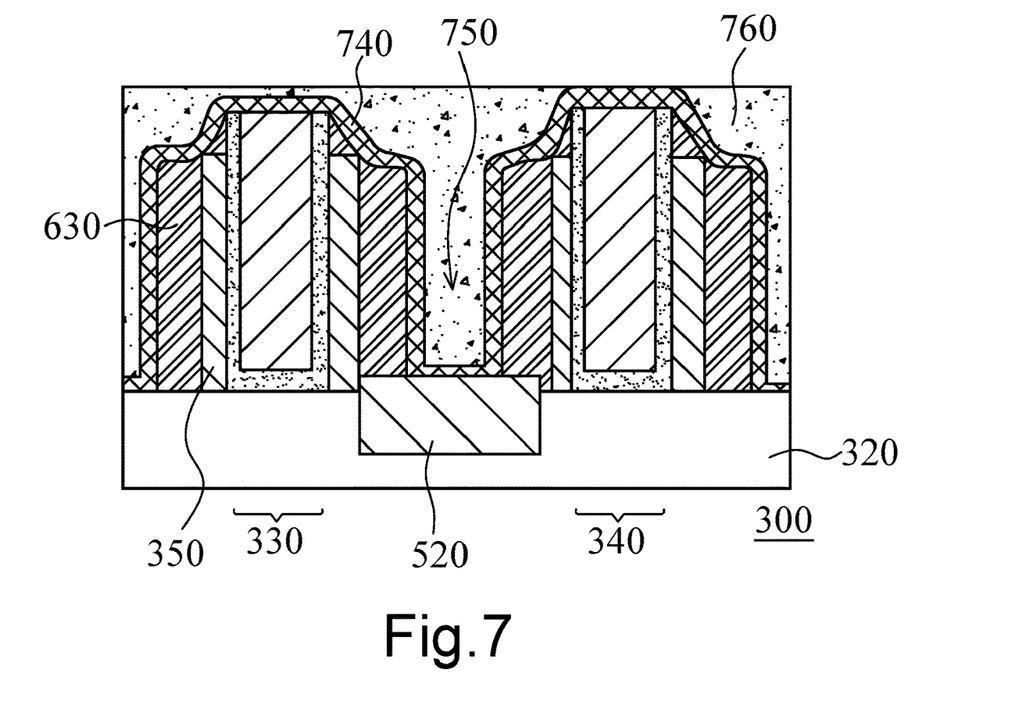

In FIG. 7, a metal glue layer 740 is deposited around the first metal gate 330 and the second metal gate 340. A trench 750 is thus defined above the silicide portion 520 by the metal glue layer 750. A metal plug 760 is then deposited within the trench 750.

In one example, the metal glue layer 740 is deposited using tungsten. In another example, the metal plug 760 is deposited using tungsten.

In FIG. 7, because of a tapered structure of the trench 750 formed with the aid of the first sidewall layer 350 and the second sidewall layer 630, an aspect ratio of the trench 750 may be reduced.

Figure 8:
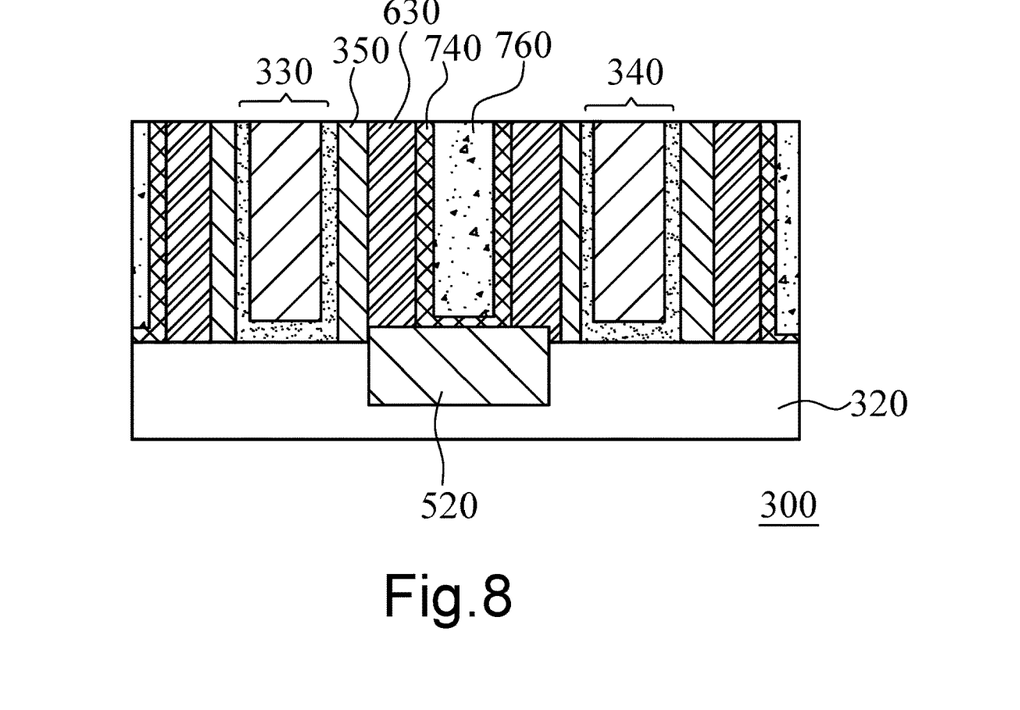

In FIG. 8, a second CMP process is performed on the metal plug 760, the metal glue layer 740, the first metal gate 330, the second metal gate 340, the first sidewall layer 350, and the second sidewall layer 630 for planarizing the metal plug 760, the metal glue layer 740, the first metal gate 330, the second metal gate 340, the first sidewall layer 350, and the second sidewall layer 630.

In the first embodiment, the first sidewall layer 350 and the second sidewall layer 630 are used for separating the first metal gate 330 or the second metal gate 340 from the metal plug 760 for reducing hole and electron scattering. In FIG. 8 since the aspect ratio of the trench 750 is reduced, a contact area of a bottom of the metal plug 760 will be more accessible in comparison to the contact area at the bottom of the contact layer 210. Therefore, resistance of the contact area of the metal plug 760 may be easier to control, and fitting a size of the contact area of the metal plug 760 to better critical dimension uniformity (CDU) may be easier.

In the first embodiment, because a hard mask layer is not used, defects caused by using a hard mask layer are reduced.

In the first embodiment, since the high-K metal gate last process is performed in advance, the silicide portion 520 suffers only minimal damage by the high temperature of the high-K metal gate last process.

In a second embodiment, the first sidewall layer is thick enough to separate the first metal gate or the second metal gate from the metal plug for reducing hole and electron scattering, so that the second sidewall layer need not be used.

Figure 9:
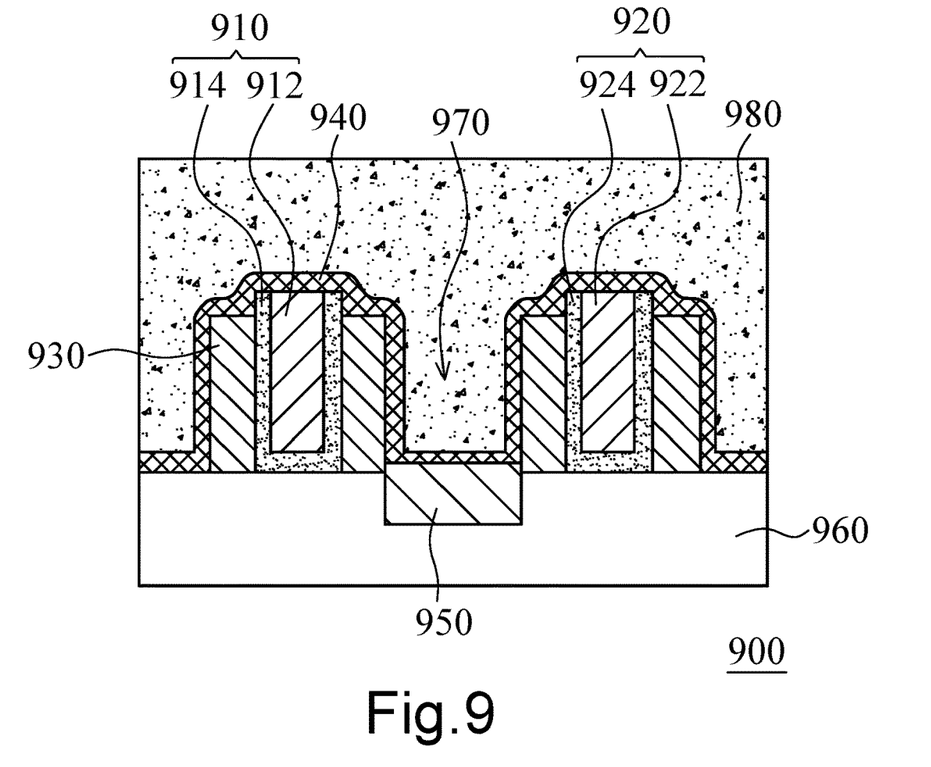
FIGS. 9-10 illustrate various cross-sectional views of a contact structure of a gate structure during formation of the contact structure according to the second embodiment.
Figure 10:
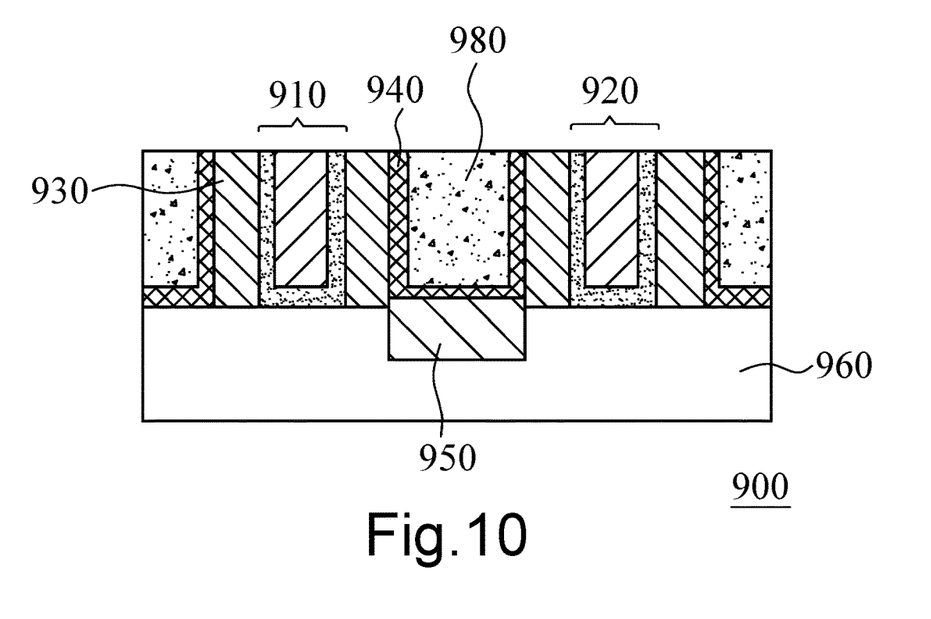

FIGS. 9-10 illustrate various cross-sectional views of a contact structure 900 of a gate structure during formation of the contact structure according to the second embodiment.

Before the formation of the contact structure 900 shown in FIG. 9, the processes shown in FIGS. 3-5 are performed.

In FIG. 9, the contact structure 900 includes a silicon substrate 960, a first metal gate 910, a second metal gate 920, a first sidewall layer 930, and a silicide layer 950.

The first metal gate 910 includes a first metal body 912 and a first spacer 914 for at least partially coating the first metal body 912. The second gate 920 includes a second metal body 922 and a second spacer 924 for at least partially coating the second metal body 922.

A metal glue layer 940 is deposited around the first metal gate 910 and the second metal gate 920. A trench 970 is thus defined above the silicide portion 950 by the metal glue layer 940. A metal plug 980 is then deposited within the trench 970.

Similarly, because of a tapered structure of the trench 970 formed with the aid of the first sidewall layer 930, an aspect ratio of the trench 970 may be reduced.

In FIG. 10, a CMP process is performed on the metal plug 980, the metal glue layer 940, the first metal gate 910, the second metal gate 920, and the first sidewall layer 930 for planarizing metal plug 980, the metal glue layer 940, the first metal gate 910, the second metal gate 920, and the first sidewall layer 930.

In the second embodiment, since the aspect ratio of the trench 970 is reduced, the abovementioned advantages of the contact structure 300 may also be taken by the contact structure 900. Repeated descriptions about advantages of the contact structure 900 are saved for brevity.

Figure 11:
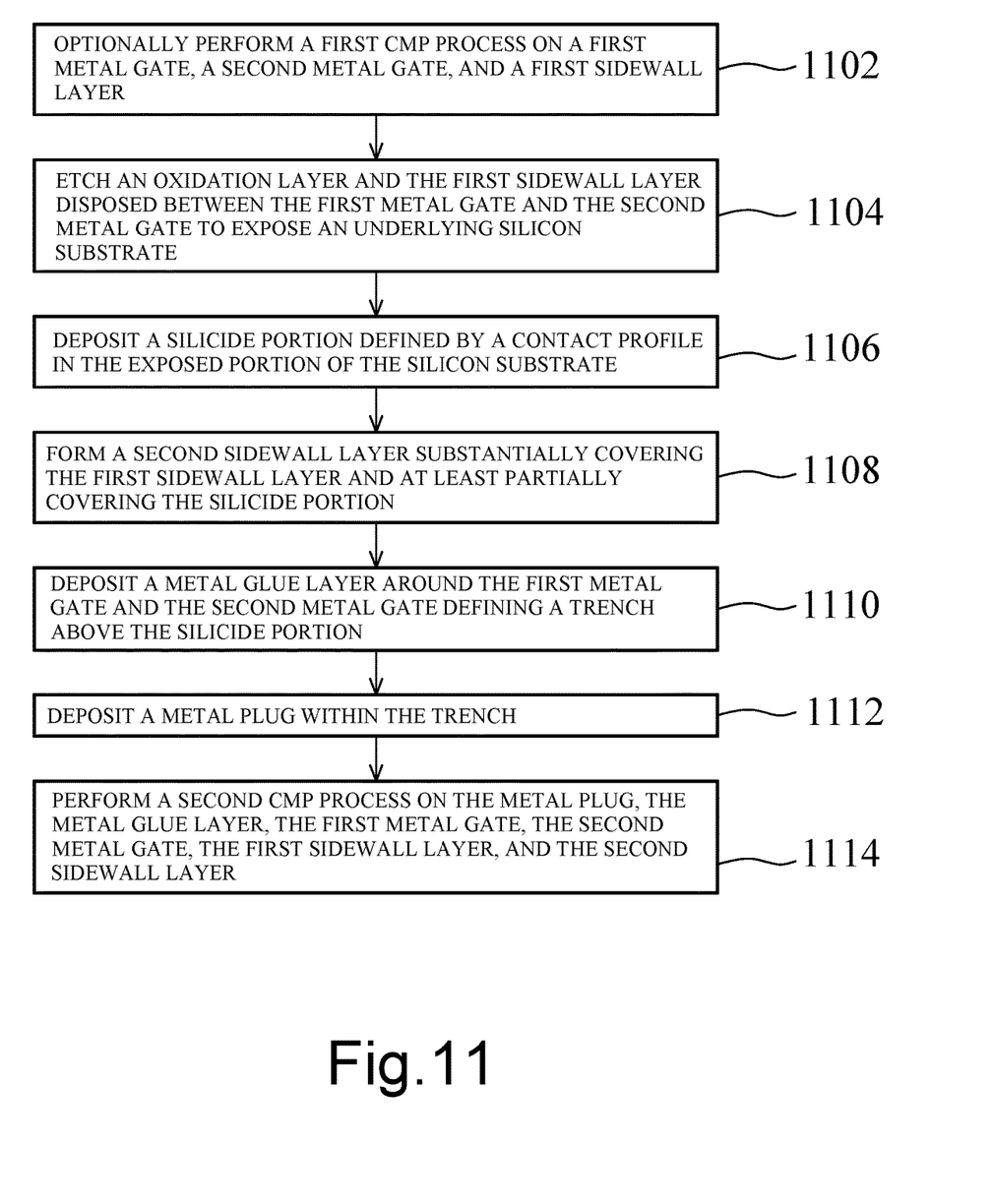
FIG. 11 illustrates a flowchart of a method of forming a contact structure of a contact structure according to the first embodiment.

FIG. 11 illustrates a flowchart of a method of forming a contact structure of a contact structure according to the first embodiment.

In FIG. 11, the method includes the following stages: Optionally perform a first CMP process on a first metal gate, a second metal gate, and a first sidewall layer (1102). Etch an oxidation layer and the first sidewall layer disposed between the first metal gate and the second metal gate to expose an underlying silicon substrate (1104). Deposit a silicide portion defined by a contact profile in the exposed portion of the silicon substrate (1106). Form a second sidewall layer substantially covering the first sidewall layer and at least partially covering the silicide portion (1108). Deposit a metal glue layer around the first metal gate and the second metal gate defining a trench above the silicide portion (1110). Deposit a metal plug within the trench (1112). Performing a second CMP process on the metal plug, the metal glue layer, the first metal gate, the second metal gate, the first sidewall layer, and the second sidewall layer (1114).

Figure 12:
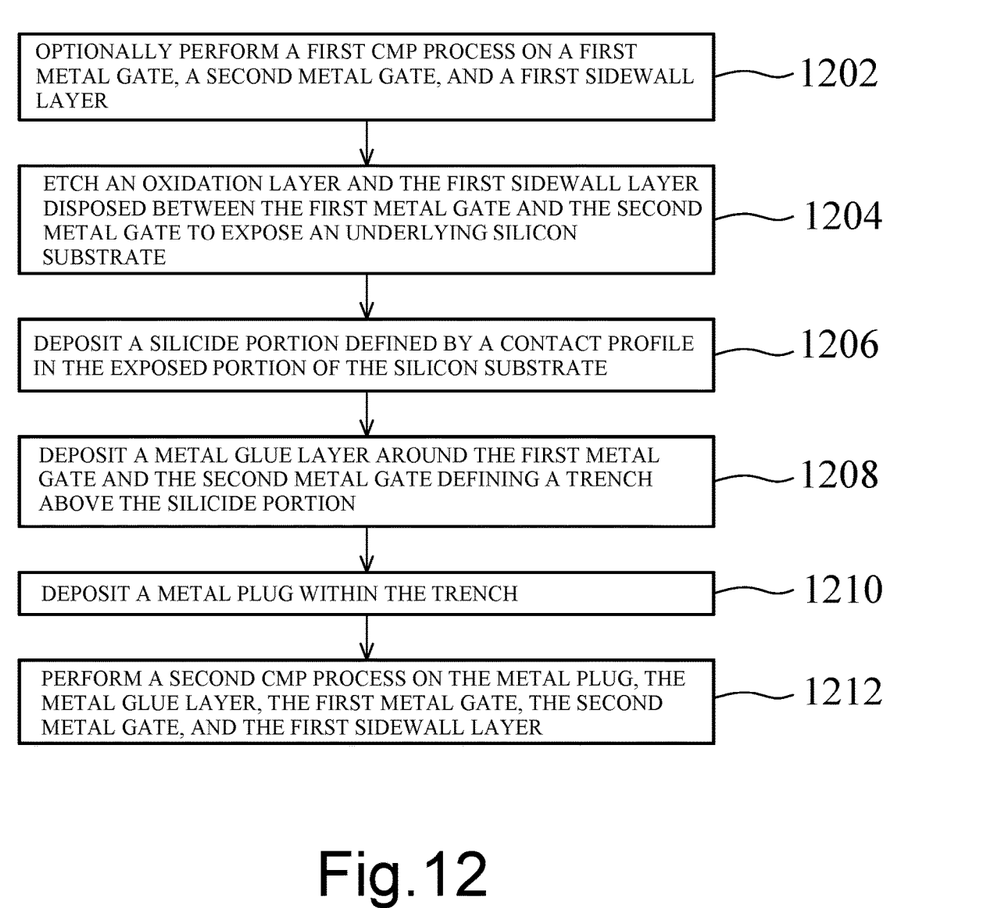
FIG. 12 illustrates a flowchart of a method of forming a contact structure of a contact structure according to the second embodiment.

FIG. 12 illustrates a flowchart of a method of forming a contact structure of a contact structure according to the second embodiment.

In FIG. 12, the method includes the following stages: Optionally perform a first CMP process on a first metal gate, a second metal gate, and a first sidewall layer (1202). Etch an oxidation layer and the first sidewall layer disposed between the first metal gate and the second metal gate to expose an underlying silicon substrate (1204). Deposit a silicide portion defined by a contact profile in the exposed portion of the silicon substrate (1206). Deposit a metal glue layer around the first metal gate and the second metal gate defining a trench above the silicide portion (1208). Deposit a metal plug within the trench (1210). Perform a second CMP process on the metal plug, the metal glue layer, the first metal gate, the second metal gate, and the first sidewall layer (1212).

This disclosure teaches a method of forming a contact structure of a gate structure. In this method, an oxidation layer and a first sidewall layer disposed between a first metal gate and a second metal gate are etched to expose an underlying silicon substrate. A silicide portion defined by a contact profile in the exposed portion of the silicon substrate is deposited. A second sidewall layer substantially covering the first sidewall layer and at least partially covering the silicide portion is formed after the silicide portion is deposited. A metal glue layer is deposited around the first metal gate and the second metal gate defining a trench above the silicide portion. A metal plug is deposited within the trench.

This disclosure also teaches a method of forming a contact structure of a gate structure. In the method, an oxidation layer and a first sidewall layer disposed between a first metal gate and a second metal gate are etched to expose an underlying silicon substrate. A silicide portion defined by a contact profile is deposited in the exposed portion of the silicon substrate. A metal glue layer is deposited around the first metal gate and the second metal gate defining a trench above the silicide portion. A metal plug is deposited within the trench.

This disclosure also teaches a contact structure of a gate structure. The contact structure includes a silicide portion, a first metal gate, a second metal gate, a first sidewall layer, a metal glue layer, and a metal plug. The silicide portion is formed in the silicon substrate. The first metal gate is formed above the silicon substrate. A second metal gate is formed above the silicon substrate. A first sidewall layer at least partially covers a first lateral side of the first metal gate and a second lateral side of the second metal gate. The first sidewall layer is interposed between the first metal gate and the second metal gate. The first lateral side of the first metal gate is oppose to the second lateral side of the second metal gate. A metal glue layer is deposited around the first metal gate and the second metal gate defining a trench above the silicide portion. A metal plug is deposited within the trench.

This written description uses examples to disclose embodiments of the disclosure, include the best mode, and also to enable a person of ordinary skill in the art to make and use various embodiments of the disclosure. The patentable scope of the disclosure may include other examples that occur to those of ordinary skill in the art. One of ordinary skill in the relevant art will recognize that the various embodiments may be practiced without one or more of the specific details, or with other replacement and/or additional methods, materials, or components. Well-known structures, materials, or operations may not be shown or described in detail to avoid obscuring aspects of various embodiments of the disclosure. Various embodiments shown in the figures are illustrative example representations and are not necessarily drawn to scale. Particular features, structures, materials, or characteristics may be combined in any suitable manner in one or more embodiments. Various additional layers and/or structures may be included and/or described features may be omitted in other embodiments. Various operations may be described as multiple discrete operations in turn, in a manner that is most helpful in understanding the disclosure. However, the order of description should not be construed as to imply that these operations are necessarily order dependent. In particular, these operations need not be performed in the order of presentation. Operations described herein may be performed in a different order, in series or in parallel, than the described embodiments. Various additional operations may be performed and/or described. Operations may be omitted in additional embodiments.

This written description and the following claims may include terms, such as left, right, top, bottom, over, under, upper, lower, first, second, etc. that are used for descriptive purposes only and are not to be construed as limiting. For example, terms designating relative vertical position may refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and may still fall within the meaning of the term "top." The term "on" as used herein (including in the claims) may not indicate that a first layer "on" a second layer is directly on and in immediate contact with the second layer unless it is specifically stated; there may be a third layer or other structure between the first layer and the second layer on the first layer. As an example, the structures, layouts, materials, operations, voltage levels, or current levels related to "source" and "drain" described herein (including in the claims) may be interchangeable as a result of transistors with "source" and "drain" being symmetrical devices. The term "substrate" may refer to any construction comprising one or more semiconductive materials, including, but not limited to, bulk semiconductive materials such as a semiconductive wafer (either alone or in assemblies comprising other materials thereon), and semiconductive material layers (either alone or in assemblies comprising other materials). The embodiments of a device or article described herein can be manufactured, used, or shipped in a number of positions and orientations. Persons skilled in the art will recognize various equivalent combinations and substitutions for various components shown in the figures.

What is claimed is:

1. A contact structure of a gate structure comprising:
   a silicide portion formed in a silicon substrate;
   a first metal gate formed above the silicon substrate;

a second metal gate formed above the silicon substrate;
spacer material at least partially covering a first lateral side of the first metal gate and a second lateral side of the second metal gate, the first lateral side of the first metal gate being opposite to the second lateral side of the second metal gate;
a first sidewall layer that (i) substantially covers the spacer material, and (ii) comprises a material that is different than that of the spacer material, wherein the first sidewall layer is interposed between the first metal gate and the second metal gate and is not disposed on top of the silicide portion;
a second sidewall layer substantially covering the first sidewall layer and at least partially covering the silicide portion;
a metal glue layer deposited around the first metal gate and the second metal gate defining a trench above the silicide portion; and
a metal plug deposited within the trench,
wherein a top surface of the first sidewall layer and a top surface of the second sidewall layer are coplanar with a top surface of the first metal gate, a top surface of the second metal gate, and a top surface of the metal plug.

2. The contact structure of claim 1, wherein the first lateral side of the first metal gate is a right side of the first metal gate, and the second lateral side of the second metal gate is a left side of the second metal gate.

3. The contact structure of claim 1, wherein the first lateral side of the first metal gate is a left side of the first metal gate, and the second lateral side of the second metal gate is a right side of the second metal gate.

4. The contact structure of claim 1, wherein a material of the second sidewall layer is selected from the group consisting of SiOx, SiOxC(1-x), SiNx, SiO(1-x)Nx, SiC(1-x)Nx, SiO(1-x-y)CxNy, Ti(1-x)Nx, and Al(1-x)Nx.

5. The contact structure of claim 1, wherein an average thickness of the second sidewall layer is between about 10 angstrom (Å) and about 50 Å.

6. The contact structure of claim 1, wherein the first sidewall layer is a nitride-based film.

7. The contact structure of claim 1, wherein a material of the first sidewall layer is selected from the group consisting of SiNx, SiO(1-x)Nx, SiC(1-x)Nx, SiO(1-x-y) CxNy, Ti(1-x)Nx, and Al(1-x)Nx.

8. The contact structure of claim 1, wherein an average thickness of the first sidewall layer is between about 1 nanometer (nm) and about 5 nm.

9. The contact structure of claim 1, wherein a distance between a first portion of the first sidewall layer at least partially covering the first lateral side of the first metal gate and a second portion of the first sidewall layer at least partially covering the second lateral side of the second metal gate is between about 15 nm and about 45 nm.

10. The contact structure of claim 1, wherein a material of the silicide portion is selected from the group consisting of Ti(1-x)Six, Co(1-x)Six, Ni(1-x)Six, Ti(1-x) SixGe, Co(1-x)SixGe, and Ni(1-x)SixGe.

11. The contact structure of claim 1, wherein a width of the first metal gate is between about 10 nm and about 30 nm, and a width of the second metal gate is between about 10 nm and about 30 nm.

12. A contact structure of a gate structure comprising:
a silicide portion formed in a substrate;
a first gate formed above the substrate;
a second gate formed above the substrate;
spacer material at least partially covering a first side of the first gate and a second side of the second gate, the first side of the first gate being opposite to the second side of the second gate;
a first sidewall layer that (i) substantially covers the spacer material, and (ii) comprises a material that is different than that of the spacer material, the first sidewall layer being interposed between the first gate and the second gate and not disposed on top of the silicide portion;
a second sidewall layer substantially covering the first sidewall layer and at least partially covering the silicide portion;
a glue layer formed around the first gate and the second gate and defining a trench above the silicide portion; and
a plug disposed within the trench,
wherein a top surface of the first sidewall layer and a top surface of the second sidewall layer are coplanar with a top surface of the first gate, a top surface of the second gate, and a top surface of the plug.

13. The contact structure of claim 12, wherein the second sidewall layer is substantially covered by the glue layer.

14. The contact structure of claim 13, wherein a material of the second sidewall layer is selected from the group consisting of SiOx, SiOxC(1-x), SiNx, SiO(1-x)Nx, SiC(1-x)Nx, SiO(1-x-y)CxNy, Ti(1-x)Nx, and Al(1-x)Nx.

15. The contact structure of claim 13, wherein an average thickness of the second sidewall layer is between about 10 angstrom (Å) and about 50 Å.

16. The contact structure of claim 12, wherein the first sidewall layer is a nitride-based film.

17. The contact structure of claim 12, wherein a material of the first sidewall layer is selected from the group consisting of SiNx, SiO(1-x)Nx, SiC(1-x)Nx, SiO(1-x-y) CxNy, Ti(1-x)Nx, and Al(1-x)Nx.

18. The contact structure of claim 12, wherein an average thickness of the first sidewall layer is between about 1 nanometer (nm) and about 5 nm.

19. A contact structure of a gate structure comprising:
a silicide portion formed in a substrate;
a first gate formed above the substrate;
a second gate formed above the substrate;
spacer material at least partially covering a first lateral side of the first gate and a second lateral side of the second gate;
a first sidewall layer formed above the substrate and substantially covering the spacer material, wherein the first sidewall layer is not disposed on top of the silicide portion;
a second sidewall layer substantially covering the first sidewall layer and at least partially covering the silicide portion;
a glue layer disposed around the first gate and the second gate that defines a trench above the silicide portion; and
a plug disposed within the trench
wherein a top surface of the first sidewall layer and a top surface of the second sidewall layer are coplanar with a top surface of the first gate, a top surface of the second gate, and a top surface of the plug.

20. The contact structure of claim 1, wherein the second sidewall layer is not formed above the first sidewall layer.

* * * * *